Sept 17, 1957 R. N. HALL 2,806,983
REMOTE BASE TRANSISTOR
Filed June 1, 1956
Fig. 1.
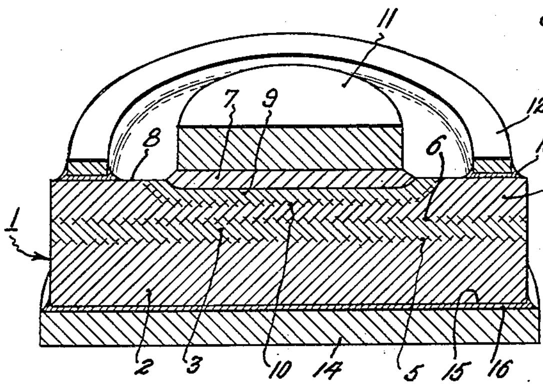
Fig. 4.
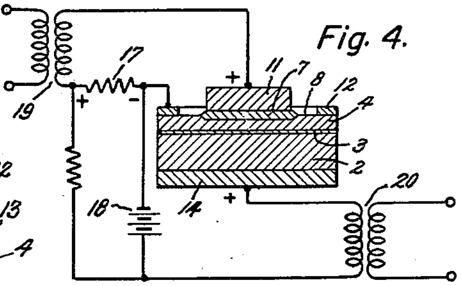
Fig. 6.
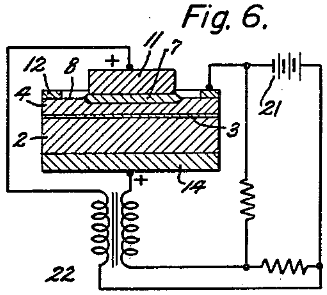
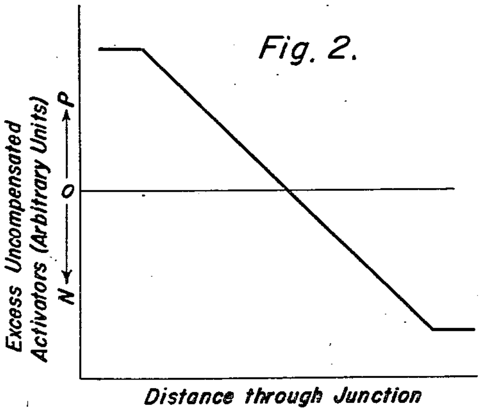
Fig. 5.
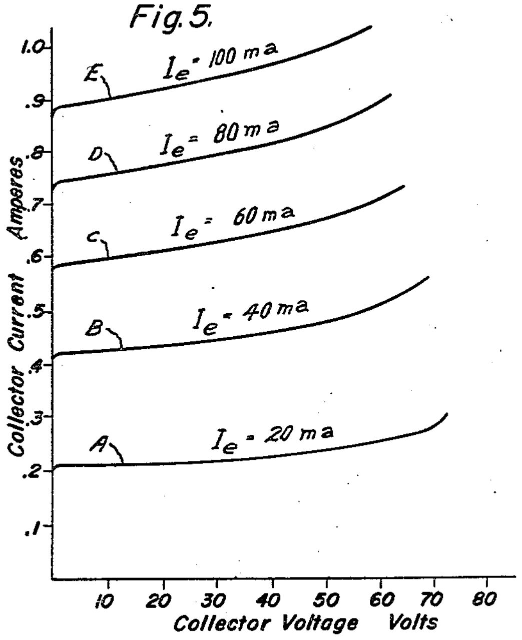
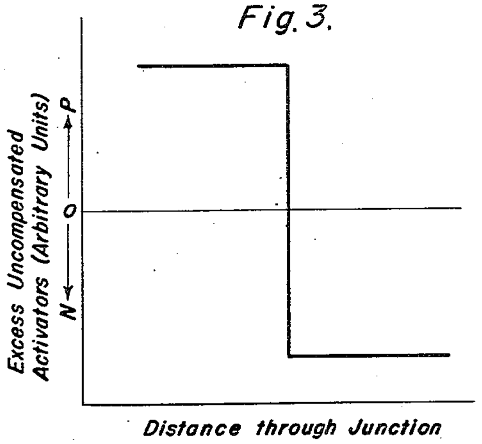
Inventor:
Robert N. Hall,
by Paul A. Frank
His Attorney.

United States Patent Office 2,806,983

Patented Sept. 17, 1957

2,806,983

REMOTE BASE TRANSISTOR

Robert N. Hall, Schenectady, N. Y., assignor to General Electric Company, a corporation of New York Application June 1, 1956, Serial No. 588,862

5 Claims. (Cl. 317—235)

The present invention relates to semiconductor signal translating devices. More particularly, the invention relates to transistor devices having at least three broad area P–N junctions therein.

P–N junction transistors such as, for example, the devices disclosed and claimed in my copending applications Serial No. 187,478, filed September 29, 1950 and Serial No. 497,510 filed March 29, 1955 both of which applications are assigned to the same assignee as the present application, generally comprise two regions of one-conductivity type semiconductor material separated by a region of opposite-conductivity type semiconductor material. The interfaces between the regions of different conductivity type within the semiconductor body are denominated as P–N junctions and constitute rectifying barriers which pass current freely in one direction and with difficulty in the opposite direction. The direction of easy current flow is known as the forward direction and the direction of difficult flow is known as the reverse direction.

A P–N junction is said to be biased in the forward direction when an electric potential is applied to the regions on either side thereof so that the polarity of the applied potential to each of the regions is of the same electrical sign as is possessed by the predominant or majority conduction carriers within each of the regions. In an N-type semiconductor, electrons are majority conduction carriers while in a P-type semiconductor electron vacancies, or positive holes are majority conduction carriers. Conversely, a P–N junction is said to be biased in the reverse direction when an electric potential is applied to the semiconductor regions bordering the junction so that the sign of the potential applied thereto is opposite to that of the predominant or majority conduction carriers in the respective zones.

In junction transistors, the two spaced regions of one conductivity characteristic are generally referred to as emitter and collector respectively and the intermediate, opposite-conductivity type semiconductor region is referred to as the base. The P–N junction between the emitter and the base regions is referred to as the emitter junction, while the P–N junction between the collector and the base regions is denominated as the collector junction. In the operation of a transistor, conduction carriers opposite in sign to the predominant conduction carriers in the base region are injected into the base region from the emitter junction and migrate by diffusion to the collector junction, causing a flow of current through the collector junction in the reverse direction. Since the collector junction possesses a high impedance transistor action results in a modification of current flow in a high impedance circuit by a flow of current in a low impedance circuit and power amplification is attained.

In order that transistor action occur the intermediate, or base, region of the transistor must be sufficiently thin to allow conduction carriers to pass from the emitter junction to the collector junction before these minority carriers are destroyed by recombination with a majority conduction carrier. The distance that a minority conduction carrier is likely to travel before recombining with a majority conduction carrier, is generally denominated as a "diffusion length." Typical widths for a base region of a junction transistor may vary from 0.0005" to 0.002". In fabricating junction transistors it becomes extremely difficult to make contact to such an extremely thin base region. This generally necessitates great care, and makes the assembly of the junction transistor a high-precision operation. Additionally, since the base region is so small, it is virtually impossible for high levels of current to flow through the extremely small contact which may be made to such a thin base region.

One object of the invention is to provide P–N junction transistor devices which do not require contact being made to an extremely thin base region.

A further object of the invention is to provide P–N junction transistor devices which combine the optimum characteristics of the grown P–N junction with the optimum characteristics of the fused P–N junction.

Still another object of the invention is to provide P–N junction transistor devices which exhibit a high order of current amplification suitable for power transistor applications.

In accord with one feature of my invention I provide a P–N junction transistor including a wafer of semiconductor material having two grown junctions therein. The two grown junctions are in spaced relationship and border two regions of one-conductivity type semiconductor separated by a thin region of opposite-conductivity type semiconductor. An opposite-conductivity type inducing activator material is fused to an exterior surface of one region of one-conductivity semiconductor material, inducing therein a region of opposite-conductivity type semiconductor and forming a third, fused, P–N junction. A base contact is made to the opposite-conductivity type inducing activator material; an emitter contact is made to the remaining portion of the surface of the one-conductivity type semiconductor region to which the opposite-conductivity type inducing material is fused, and a collector contact is made to the remaining one-conductivity type semiconductor region. When the emitter is biased in the forward direction and the collector is biased in the reverse direction a junction transistor device is produced which exhibits highly desirable amplification characteristics at high collector currents. Such a device requires no electrical contact to the thin intermediate base region, and utilizes the optimum characteristics of both grown and fused junctions.

The novel features believed characteristic of the invention are set forth in the appended claims. The invention itself, together with further objects and advantages thereof may best be understood with reference to the following description taken in conjunction with the appended drawing in which, Figure 1 illustrates a junction transistor constructed in accord with the invention.

Figure 2 illustrates in graphical form the impurity distribution characteristics of a grown P–N junction.

Figure 3 illustrates in graphical form the impurity distribution characteristics of a fused P–N junction.

Figure 4 illustrates in schematic form the device of Figure 1 utilized as an amplifier.

Figure 5 illustrates in graphical form the collector characteristics of a junction transistor circuit as illustrated in Figure 4, and Figure 6 illustrates a schematic circuit diagram in which the device of Figure 1 is utilized as an oscillator.

In Figure 1, a remote base transistor, constructed in accord with the invention, is fabricated from a wafer 1 of a semiconductive material as, for example, germanium or silicon. Wafer 1 includes a first zone 2 of one-conductivity type semiconductive material, a second zone 3 of opposite-conductivity type semiconductor material and a third region 4 of one-conductivity type semiconductor material. For clarity of expression wafer 1 will be described as being an N–P–N wafer in which regions 2 and 4 possess N-type conductivity characteristics and zone 3 possesses P-type conductivity characteristics, although it will be appreciated that the conductivities could be reversed. The interfaces between the second thin region 3 of P-type semiconductor material and the first and third regions 2 and 4 respectively of N-type semiconductor material constitute grown P–N junctions 5 and 6.

A quantity of acceptor activator impurity 7, for example indium, is fused to, and alloyed with, a portion of one major surface 8 of semiconductor wafer 1, converting the surface adjacent region 9 immediately thereunder to P-type semiconductor and creating, at the interface of this region with N-type region 4, a fused P–N junction 10. A base electrode 11 is attached to indium layer 7, either during or after the fusion of the indium to wafer 1. An emitter contact 12 is attached to an exposed portion of major surface 8 of wafer 1, by contacting a suitable electrode with a suitable solder 13, which may for example be any donor activator impurity or alloy thereof or an element or alloy which produces no change in conductivity type, for example a tin solder. A collector electrode 14 is fastened to the opopsite major surface 15 of semiconductor wafer 1 by means of a similar solder 16, which may comprise any of the materials utilized for solder 13. Contacts 11, 12 and 14 may conveniently be of nickel or fernico.

Wafer 1 may conveniently be cut from an ingot of germanium prepared by the process described and claimed in my aforementioned application Serial No. 497,510. In accord with this method a melt of germanium or silicon having therein a quantity of donor and acceptor activator impurities is heated to a temperature above the melting point of the alloy produced thereby, and a monocrystalline ingot of semiconductor material is grown therefrom by the Czochralski seed crystal withdrawal technique. During the growing of the ingot the power supplied to the crucible within which the melt is contained is alternately raised and lowered, thus alternately increasing and decreasing the rate of growth of the monocrystalline ingot. Since the segregation coefficient of the significant donor and acceptor impurities within the melt varies as a function of the rate of growth, the amount of these impurities present within the growing ingot changes so that alternate N-type and P-type conductivity zones are produced within the growing ingot. With proper control of the power cycle, an ingot may be grown having regions of N-type conduction characteristics interspaced with thin regions having P-type conductivity characteristics. The thickness of the P-type regions may readily be adjusted to from 0.0005″ to 0.002″. Thus, wafer 1 of semi-conductor material may for example comprise two regions 2 and 4 of N-type germanium separated by a thin region from 0.0005″ to 0.002″ thick of P-type germanium. N-type regions 2 and 4 of wafer 1 may, for example, comprise germanium impregnated with an excess of a significant donor activator impurity as, for example, phosphorus, arsenic or antimony. While these regions may also contain minute quantities of acceptor activator impurities as for example, boron, aluminum, gallium or indium, the number of donor activator atoms present therein is in excess of the number of acceptor activator atoms present therein, rendering these regions N-type. The thin P-type region 3, on the other hand, while possessing both donor and acceptor activator impurities possesses these impurities in such relative quantities that a greater proportion of acceptor activator atoms than donor activator atoms are present, and the region exhibits P-type conductivity characteristics.

The interfaces between the P-type and N-type regions are grown P–N junctions. As used herein the term "grown P–N junction" is used to connote the rectifying region between P-type and N-type semiconductor regions in which the change in conductivity type is produced in a semiconductor ingot while the ingot is grown from a melt of semiconductor material with which it is in equilibrium. The above described process is one example of processes for the production of grown P–N junctions. Another such process is the zone-melting technique as described by Patent No. 2,739,088 to W. G. Pfann.

P–N junction 10, on the other hand, is a fused or alloyed junction. As used herein the term "fused P–N junction" is used to connote a rectifying barrier produced by the fusion to the surface of a one conductivity type semiconductor monocrystalline wafer a quantity of opposite-conductivity type activator impurity. The characteristics of such fused P–N junctions, as well as the method of formation thereof, are described in my aforementioned copending application Serial No. 187,478. In general, fused P–N junctions are formed by depositing upon a monocrystalline wafer of one conductivity type, as for example N-type germanium, a quantity of opposite-conductivity type inducing activator impurity, as for example indium, and heating the wafer to a temperature above the melting point of the activator impurity but below the melting point of the semiconductor. When the activator impurity melts, the surface adjacent portion of the semiconductor wafer is dissolved by the activator impurity, creating an impurity-rich alloy melt. When this impurity-rich alloy melt cools and freezes, opposite-conductivity type semiconductor material is recrystallized out of the melt to form a P–N junction at the interface between the one-conductivity type semiconductor material and the recrystallized opposite-conductivity type semiconductor material. Since the recrystallized opposite-conductivity type semiconductor is rich in activator impurity atoms, and since the original semiconductor wafer may be made rich in one-conductivity-type activator impurity atoms, the fused P–N junction may be heavily impregnated with activators, and highly P-type and N-type respectively, on either side of the junction.

As may be noted from the illustrated embodiment of Figure 1, it is not necessary to make an electrical contact to intermediate P-type semiconductor region 3 of wafer 1, thus facilitating the fabrication of junction transistors without the necessity of high-precision operations. Additionally, it may be observed that since base electrode 11 and emitter electrode 12 are both connected to the same major surface of wafer 1 these two electrodes may be positioned relatively close to one another so that there is a minimum path for current flow between base and emitter electrodes through semiconductor wafer 1, thus facilitating high efficiency of operation. It is desirable, for high efficiency operation, that base electrode 11 and emitter electrode 12 be as closely located as is possible, without short-circuiting. In the construction illustrated in Figure 1, it is possible to locate these elements within 0.5 to 1 millimeter of one another.

A further advantage of the device of this invention is derived from the ease with which fused function 10 may be located in close proximity to grown junction 6. In a transistor, these junctions must be within one diffusion length of each other. A diffusion length is defined as the statistical distance an injected minority charge carrier diffuses before it is annihilated by recombination with a majority charge carrier. This distance (in the case of an electron) is further defined by the relationship—

$$L_{De}=\sqrt{D_e t}$$

where $L_{De}$=the diffusion length of an electron
$D_e$=the diffusion coefficient of an electron
$t$=the lifetime of an electron Utilizing the construction illustrated in Figure 1, junctions 10 and 6 may be located within a diffusion length of one another without sacrificing other desirable characteristics, as would be done, for example, if it were necessary to make the entire thickness of N-type region 4 as this as 0.001".

One specific example of a remote base transistor similar to that illustrated in Figure 1 was fabricated from a 0.16" diameter wafer of germanium containing a P-type layer of approximately 0.0008" in thickness. The emitter junction was made by alloying 0.08" diameter droplet of indium to the N-type region on one side of the P-layer. The thickness of the N-type layer remaining between the junction so formed and the remote P-type layer was approximately 0.004". Non-rectifying electrodes of fernico were attached to the emitter and collector regions using an alloy solder of arsenic and tin.

While the device of Figure 1 has been described primarily with reference to a wafer 1 having an intermediate P-type conductivity region between two N-type conductivity regions and a fourth region of P-type conductivity characteristics induced by the fusion of an acceptor activator impurity to the surface of region 4 it will be appreciated that the conduction characteristics of all these regions could be reversed and a transistor constructed in accord with this embodiment made by the fusion of a donor activator impurity to a P–N–P semiconductor wafer. In this case electrodes 12 and 14 are fastened to surfaces 8 and 15 respectively of semiconductor wafer 1 with a neutral or acceptor solder as, for example, tin or indium.

Figures 2 and 3 of the drawing present graphically the impurity distribution characteristics of grown and fused P–N junctions respectively. From Figure 2 it may be seen that, in a grown junction, while the activator impurity concentration in the vicinity of the junction varies with distance through the junction, from highly P-type to highly N-type, the transition is a gradual one occurring over a relatively large distance and results in a relatively wide junction. Because of the gradual impurity gradient across the junction of Figure 2 and the thickness of the junction such a grown junction possesses a high reverse breakdown voltage. Such a junction characteristic also provides low capacitance, a quality highly desirable for a transistor collector junction.

The characteristics of the fused junction, on the other hand, as represented by Figure 3, are such as to result in a rapid change from a highly P-type conduction characteristic to highly N-type conduction characteristic with an abrupt impurity concentration gradient across the junction and a very narrow junction. This characteristic results in attaining extrmely low resistivity in the regions on either side of the junction. This also results in an extremely thin junction and a steep gradient of activator impurities across the junction. All of these characteristics contribute to a junction which is ideally suited for the emitter junction of a junction transistor and which possesses high emitter efficiency and good characteristics for the injection of minority charge carriers.

As shown by Figures 2 and 3, a grown P–N junction is ideally suited for the collector junction of a junction transistor, and the fused P–N junction is ideally suited for the emitter junction of a junction transistor. The devices of this invention make optimum use of the characteristics of both grown junctions and fused junctions to produce a highly efficient high power junction transistor.

In Figure 4, the remote base transistor, one embodiment of which is discussed with respect to Figure 1, is shown in electrical circuit configuration for the amplification and translation of electric signals. In Figure 4, as in Figure 1, region 2 of the remote base transistor comprises a collector region and electrode 14 connected thereto comprises a collector electrode. Region 4 comprises an emitter region and electrode 12 connected thereto comprises an emitter electrode. Surface adjacent region 9 comprises a base region, remote from intermediate P-type layer 3, and electrode 11 connected to base region 9 comprises a base electrode. Emitter electrode 12 is biased negatively with respect to base electrode 11 through resistance 17 by means of a source of unidirectional electrical potential represented conventionally by battery 18. Since region 4 possesses N-type conductivity characteristics, and base region 9 possesses P-type conductivity characteristics the junction between these two regions is biased in the forward direction. The same battery 18 biases collector electrode 14 positive with respect to base electrode 11. Since collector region 2 possesses N-type conductivity characteristics the collector is biased in the reverse direction. Input signals are supplied between base electrode 11 and emitter electrode 12 by means of an input transformer 19. Output from the amplifier stage is taken between collector electrode 14 and emitter electrode 12 by means of output transformer 20. While transformer coupling is illustrated herein it is obvious that other means of coupling may be utilized to supply electrical signals to, and derive electrical signals from, the amplifier stage.

A family of collector characteristics for grounded emitter operation of this transistor as illustrated in Figure 4, are shown in Figure 5. In Figure 5, lines A, B, C, D and E represent a family of curves for different values of base current of 20, 40, 60, 80 and 100 milliamperes respectively.

As may be seen from the curves of Figure 5 good amplification characteristics are obtained from the circuit of Figure 4. With reverse collector bias, input and output currents of the circuit of Figure 4 are such as to cause the input impedance to the circuit to be positive, thereby leading to stable operation. Thus, the operating point of the circuit is uniquely determined for any value of input voltage. If, on the other hand, the collector were biased in the forward direction the operating characteristic of the circuit would display a region of negative input resistance resulting in instability. In such a case, the circuit would not be suited for linear amplification as is the circuit of Figure 4.

Figure 6 illustrates the device of Figure 1 connected as an oscillator for the generation of high frequency alternating current. In Figure 6, emitter electrode 12 is biased negatively with respect to base electrode 11 by means of a source of unidirectional potential represented generally as battery 21. The same battery biases collector electrode 14 positive with respect to base electrode 11. The emitter is thus biased in the forward or easy flow direction and the collector is biased in the reverse or difficult flow direction. Feedback between the collector circuit and the emitter circuit is obtained through feedback transformer 22.

Devices constructed in accord with the invention, one example which is illustrated in Figure 1, and connected in amplifier circuits as illustratde in Figure 4, or oscillator circuits as illustrated in Figure 6, exhibit an unusually high current amplification, as compared with conventional NPN or PNP transistors. This is believed to be due to the fact that the current amplification factor $\alpha$ of the remote base transistor is of a complex nature, and includes the current amplification factor of the remote base junction and the current amplification factor of the remote P-type (or N-type) layer. In the operation of the remote base transistor, minority conduction carriers, which in the illustrated PNPN configuration are positive holes, are injected at the base junction, where the base electrode is fused to the emitter region, and reach the thin P-layer by diffusing through the thin layer of N-type material which separates the two. Since this separation is less than one diffusion length or one or two tenths of a millimeter, the loss of minority carriers by recombination is small. Injected holes which arrive at the thin P-type layer induce the flow of much greater electron currents through the remote P-type layer. Current gains of several hundred from the remote base transistors of the invention are quite common.

As an example of the high efficiency and great utility of the remote base transistors of this invention, one PNPN remote base transistor with a thin intermediate P-type layer exhibited a power gain of approximately 25 decibels at an output level of approximately 1 watt with a 6 volt collector bias voltage. With the power efficiency defined as a ratio of unidirectional power output to the total of unidirectional power supply, efficiencies of as high as 40% have been observed with the devices operating as a class A amplifier. This value may be compared with the maximum theoretical limit of efficiency for class A power amplification which is 50%. Another such device operated as a class A amplifier with a 12 volt collector bias voltage exhibited a power gain of approximately 30 decibels at an output power level of approximately 2 watts. This device exhibited a power efficiency of slightly more than 40% with a load resistance of approximately 100 ohms at a 2 watt stand-by power level.

Remote base transistors constructed in accord with this invention exhibit useful frequency ranges, and a number of units have been tested and exhibited alpha-cut-off frequencies of approximately 1000 kilocycles.

While the invention has been described in respect to particular embodiments thereof many modifications and changes will occur to those skilled in the art. Accordingly, I intend by the appended claims to cover all such modifications and changes as fall within the true spirit and scope of the foregoing disclosure.

What I claim as new and desire to secure by Letters Patent of the United States is:

1. An amplifying asymmetrically conductive device comprising a monocrystalline wafer of semiconductive material having therein first and second spaced zones of one-conductivity type semiconductive material separated by and contiguous with a third zone of opposite-conductivity type semiconductive material, the interfaces between said third zone and said first and second zones comprising grown P–N junctions, a mass of opposite-conductivity type inducing activator impurity fused to and alloyed with a surface region of said first zone and producing therein a fused P–N junction, said fused junction being located within one diffusion length of said third zone, a first electrode contacting said mass of activator material, a second electrode contacting said first zone and in close proximity to said first electrode and a third electrode contacting said second zone.

2. An amplifying asymmetrically conductive device comprising a monocrystalline wafer of semiconductive material having therein first and second zones of one-conductivity type semiconductive material separated by and contiguous with a third zone of opposite-conductivity type semiconductive material, the interfaces between said third zone and said first and second zones comprising grown P–N junctions, a mass of opposite-conductivity type inducing activator impurity fused to and alloyed with a surface portion of said first zone and producing therein a fused P–N junction, said fused junction being located within one diffusion length of said opposite-conductivity type zone, a base electrode contacting said mass of activator material, an emitter electrode contacting said first zone and in close proximity to said base electrode and a collector electrode in non-rectifying contact with said second zone.

3. An amplifying asymmetrically conductive device comprising a monocrystalline wafer of one-conductivity type semiconductive material having opposed major surfaces and having therein a thin planar zone of opposite-conductivity type, the interfaces between said zone and the remainder of said wafer comprising grown P–N junctions, a mass of opposite-conductivity type inducing activator impurity fused to and alloyed with a first portion of a first major surface of said wafer and producing in the body of said wafer a fused P–N junction, said fused junction being located within one diffusion length of said opposite-conductivity type zone, a first electrode contacting said mass of activator material, a second electrode contacting a second portion of said first major surface of said wafer in close proximity to said first electrode and a third electrode contacting an opposite major surface of said wafer.

4. An amplifying asymmetrically conductive device comprising a monocrystalline wafer of one-conductivity type semiconductive material having opposed major surfaces and having therein a thin planar zone of opposite-conductivity type, the interfaces between said zone and the remaider of said wafer comprising grown P–N junctions, a mass of opposite conductivity type inducing activator impurity fused to and alloyed with a first portion of one major surface of said wafer and producing in the body of said wafer a fused P–N junction, said fused junction being located within one diffusion length of said opposite-conductivity type zone, a base electrode contacting said mass of activator material, an emitter electrode in non-rectifying contact with a second portion of said first major surface of said wafer and in close proximity to said base electrode, and a collector electrode in non-rectifying contact with the opposite major surface of said wafer.

5. An amplifying asymmetrically conductive device comprising a monocrystalline wafer of one-conductivity type semiconductive material having opposed major surfaces and having therein a thin planar zone of opposite-conductivity type, the interfaces between said zone and the remainder of said wafer comprising grown P–N junctions, a mass of opposite-conductivity type inducing activator impurity fused to and alloyed with a first portion of one major surface of said wafer and producing in the body of said wafer a fused P–N junction, said fused junction being located within one diffusion length of said opposite-conductivity type zone, a base electrode contacting said mass of activator material, an emitter electrode in non-rectifying contact with a second portion of said first major surface of said wafer and in close proximity to said base electrode, and a collector electrode in non-rectifying contact with the opposite major surface of said wafer.

References Cited in the file of this patent

UNITED STATES PATENTS

| | | |
|---|---|---|
| 2,569,347 | Shockley | Sept. 25, 1951 |
| 2,709,232 | Thedieck | May 24, 1955 |

FOREIGN PATENTS

| | | |
|---|---|---|
| 1,109,404 | France | Sept. 28, 1955 |